United States Patent [19]

Clem

[11] 4,371,740
[45] Feb. 1, 1983

[54] CONDUCTIVE ELEMENTS FOR PHOTOVOLTAIC CELLS

[75] Inventor: Katherine V. Clem, Pittsford, N.Y.

[73] Assignee: Eastman Kodak Company, Rochester, N.Y.

[21] Appl. No.: 349,351

[22] Filed: Feb. 16, 1982

Related U.S. Application Data

[63] Continuation of Ser. No. 171,576, Jul. 23, 1980, abandoned.

[51] Int. Cl.³ .................... H01L 31/06; B32B 17/06
[52] U.S. Cl. .................... 136/256; 136/260; 136/264; 427/109; 428/336; 428/432
[58] Field of Search .................... 136/256, 260, 264; 204/192 P; 428/432, 336; 427/110, 160, 165, 166, 168, 169

[56] References Cited

U.S. PATENT DOCUMENTS

| | | | |
|---|---|---|---|
| 2,566,346 | 9/1951 | Lytle et al. | 428/336 |
| 2,617,742 | 11/1952 | Olson | 428/432 |
| 3,107,177 | 10/1963 | Saunders et al. | 427/110 |
| 3,677,814 | 7/1972 | Gillery | 427/108 |
| 3,880,633 | 4/1975 | Jordan et al. | 65/60 |
| 3,949,146 | 4/1976 | Kane et al. | 428/432 |
| 3,959,565 | 5/1976 | Jordan et al. | 428/432 |
| 4,066,815 | 1/1978 | Olink et al. | 428/336 |
| 4,146,657 | 3/1979 | Gordon | 427/126 |
| 4,172,159 | 10/1979 | Marcault | 427/160 |
| 4,207,119 | 6/1980 | Tyan | 136/258 |
| 4,239,809 | 12/1980 | Lampkin et al. | 427/74 |
| 4,263,335 | 4/1981 | Wagner et al. | 427/29 |
| 4,265,974 | 5/1981 | Gordon | 428/432 |
| 4,293,326 | 10/1981 | Terneu et al. | 65/60 D |
| 4,293,594 | 10/1981 | Yoldas et al. | 427/107 |

FOREIGN PATENT DOCUMENTS 519023  11/1955  Canada .................... 427/110

OTHER PUBLICATIONS

R. G. Livesay et al., "A Technique For The Production of Transparent, Electrically Conducting Tin Oxide Films On Glass Substrates," *J. Sci. Inst.* vol. 1, p. 947 (1968).

J. Kane et al., "Chemical Vapor Deposition of Transparent Electrically Conductive Tin Oxides Films Formed From Dibutyl Tin Acetate," *J. Electrochem. Soc.*, vol. 122, pp. 1144–1149 (1975).

*Primary Examiner*—Aaron Weisstuch
*Attorney, Agent, or Firm*—Arthur H. Rosenstein

[57] ABSTRACT

A conductive element such as an electrode useful in photovoltaic cells comprises a soda-lime glass support having thereon a layer containing polycrystalline $SnO_2$ and a fluorine dopant, said conductive electrode being substantially haze-free and having a transmittance of radiation between 400 and 800 nm greater than 70% and an electrical resistance less than 30 ohm per square. The conductive element is particularly useful in thin film cadmium sulfide/cadmium telluride photovoltaic cells.

7 Claims, 3 Drawing Figures

CONDUCTIVE ELEMENTS FOR PHOTOVOLTAIC CELLS

This is a continuation of application Ser. No. 171,576, filed July 23, 1980, abandoned.

BACKGROUND OF THE INVENTION

This invention relates to $SnO_2$ conductive elements which are particularly useful in thin film photovoltaic cells.

Effective conversion from expensive petroleum-based energy sources to solar energy sources, such as photovoltaic cells, has been delayed by two factors—the cost of mass-producing such and the low conversion efficiency achieved by such cells. Any improvement in either factor is capable of moving industry towards the use of more solar cells, and an improvement in both has been a long-sought goal.

The use of p-n cadmium telluride—cadmium sulfide photovoltaic cells having thin layers as described in U.S. Pat. No. 4,207,119 has considerably improved the efficiency of the cells. A limiting factor to further improvements in the efficiency of such cells is the window electrode through which the solar cell is illuminated.

Conventionally, the window electrode comprises a glass support with a transparent and conductive coating as for example $In_2O_3$ such as is available under the trademark Nesatron ® from PPG Industries. These materials and others such as $Cd_2SnO_4$ and $CdSnO_3$ yield films of low resistivity and high transmittance, but such materials are not readily available and the processes required for their preparation make them extremely expensive for use in photovoltaic cells.

Glass electrodes containing more available and less expensive coatings have been sought. R. G. Livesey, E. Lyford and H. Moore, J. of Physics E: J. of Scientific Instruments, 1, 947 (1968) describe a transparent conductive tin oxide film on glass prepared by flowing oxygen through a flask of heated $SnCl_2 \cdot 2H_2O$ onto glass substrates. These tin oxide films had 85% transmittance but electrical resistivities of 100–500 ohm per square. Films having lower resistance were acknowledged by the authors to be undesirable due to haze.

James Kane, H. P. Schwizer and Werner Kern in Volume 123, No. 2 of *J. Electrochem. Soc: Solid-State Science and Technology*, pages 270–276 (February, 1976) describe the use of a soda-lime glass support for a tin oxide film wherein the soda-lime glass surface is necessarily treated to remove sodium from the soda-lime glass at the surface to prevent haze from forming.

U.S. Pat. No. 3,880,633 describes a tin oxide film on glass prepared by spraying a solution of $SnCl_2$ in methanol with small amounts of ammonia bifluoride. This method discloses an acid pretreatment of the glass support prior to the application of the $SnO_2$ layer, forming a silica film over the support, to not only lessen the resulting haze in the $SnO_2$ layer and glass support but also to be instrumental in obtaining a satisfactory layer resistance and high transmittance. This method achieves 78% transmittance and electrical resistance as low as 10 ohm/square, but the resulting tin oxide films are still hazy. The appearance of haze on the electrode film causes light scattering (a loss of transmittance).

Thus, the prior art is replete with references to the desirability of using soda-lime glass as the support for conductive elements as this material is extremely inexpensive, but has not found an acceptable way of using the material without involving the expense of first pretreating the support to remove sodium so that the support is no longer soda-lime glass per se or to add a layer of silica on the soda-lime glass. A substantially haze-free element formed from a support of soda-lime glass containing a layer of $SnO_2$ directly on the soda-lime glass support is deemed to be highly useful in this art.

SUMMARY OF THE INVENTION

In accordance with the present invention there is formed a conductive element useful in photovoltaic cells which has a transmittance at 400–800 nm greater than 70%; an electrical resistance 30 ohm/square or less; is substantially haze-free; and requires no pretreated support or extra layer on the support.

A conductive element in accordance with the present invention comprises a soda-lime glass support having thereon a layer containing polycrystalline $SnO_2$ and a fluorine dopant, said conductive element being substantially haze-free and having a total transmittance of radiation between 400 and 800 nm greater than 70% and an electrical resistance less than 30 ohm/square.

Total transmittance is the percent transmittance measured by a integrating sphere while specular transmittance is the percent transmittance measured with a small angle detector. The specular transmittance is, of course, always less than total transmittance.

In accordance with another aspect of this invention a method of preparing a polycrystalline $SnO_2$ conductive element comprises heating a soda-lime glass support at a temperature of at least about 450° C. in the presence of a source or sources of $SnCl_2$ and the fluorine dopant, said heating step being carried out in an oxygen-containing atmosphere and wherein the source or sources of $SnCl_2$ and dopant are heated to a temperature of less than about 480° C.

In accordance with yet another aspect of the present invention a photovoltaic cell comprises crystalline layers of p-type cadmium telluride and n-type cadmium sulfide in operative low impedance contact with a conductive element as described above.

DESCRIPTION OF THE PREFERRED EMBODIMENTS

Figure 2:
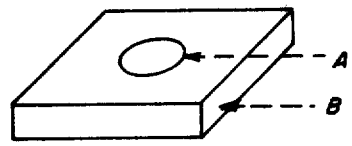
FIG. 2 is a view of a support to be coated.

The conductive element of the present invention comprises a soda-lime glass support having thereon a tin oxide layer containing a fluorine dopant.

BY "soda-lime glass" support is meant the support material is strictly soda-lime glass and is not pretreated to remove sodium from the surface of the support to result in a surface layer of something other than soda-lime glass or to add a protective layer over the soda-lime glass. The support used in this invention requires no additional expensive treatment in order to achieve good transmittance, low resistance, and the substantial absence of haze. The support is preferably soda-lime glass with 90% transmittance. Although the thickness of the glass support is not critical, thicknesses of from about 0.5 to about 5 mm are preferred.

It is noted that the method of the present invention is useful with any inorganic, high temperature-resistant, nonconductive materials as the support, such as silica, quartz, borosilicate and other glasses, alumina and ceramics. These supports, however, result in relatively expensive electrodes which have limited use in photovoltaic cells.

The layer on the support comprises tin oxide and a fluorine dopant. The fluorine dopant is basically any fluorine-containing material such as SnClF, $SnF_2$, $H_2SiF_6$ and $NH_4FHF$. The only requirements for the fluorine dopant are that it is volatile at any processing temperature used in heating it and the $SnCl_2$ to form $SnO_2$ on the support.

By a soda-lime glass support "having thereon a layer containing polycrystalline $SnO_2$ and a fluorine dopant" is meant the layer is formed directly on the soda-lime glass support and not on an intervening layer of any kind or on a support that is treated so that the surface of the support is no longer soda-lime glass.

In photovoltaic cells, it is desirable for the conductive element to have low electrical resistance so that the Joule loss is reduced and the cell efficiency is therefore increased. Thus the $SnO_2$ layer has a resistance of less than 30 ohm/square and preferably less than 20 ohm/square. It is also desirable that the layer possess good light transmittance. Thus, at 400-800 nm the transmittance of radiation is advantageously greater than 70% and preferably greater than 80%.

The conductive elements of the present invention are substantially haze-free. This is important in the use of the conductive elements in photovoltaic cells as haze leads to undesirable interactions between the conductive element and other layers in such cells such as CdTe and CdS. An example of such interaction is given in U.S. Pat. No. 3,880,633. Further, if the conductive element is hazy, light-scattering occurs, which results in loss of transmittance. By substantially haze-free it is meant that a visual examination of the material gives the impression of a relatively clear material. That is, there is no detection of fog by the naked eye.

Conductive elements, as described herein, include electrodes such as are used with photovoltaic cells, display electrodes, and electrodes for electrophotographic plates; optical filters; and antistatic elements. A particularly preferred conductive element is an electrode such as a window electrode for photovoltaic cells.

The layer containing tin oxide and fluorine dopant is preferably thin. Preferred conductive element layers are from 1000 to about 10,000 Å. The layer potentially comprises the fluorine dopant in any concentration but the preferred layer contains from about 0.001 to about 5 wt/% of the fluorine dopant.

The layer containing the doped $SnO_2$ is polycrystalline and the crystallites preferably are oriented relative to the glass support such that the (200) and (110) crystallographic planes are oriented parallel to the plane of the glass surface. Although the crystallites are of any size it is preferred that the $SnO_2$ crystals be less than one micrometer and more preferably less than 0.5 micrometer.

The polycrystalline $SnO_2$ conductive element is prepared by heating a support of soda-lime glass to a temperature of at least about 450° C. in an environment containing a source of $SnCl_2$ and, either in the same source or a separate source, a fluorine dopant. The source of $SnCl_2$ and dopant is heated to a temperature of less than 480° C. but high enough to volatilize the $SnCl_2$ and dopant toward the support. Preferably the temperature to which the source is heated is from 200° C. to 400° C. if the method used is close-spaced evaporation. If the method of deposition is by transport mode (the source vapors are transported over long distances, such as in Example 7), then temperatures up to 480° C. are useful. This operation is carried out in an atmosphere where the oxygen content is at least about 15%.

A particularly preferred method of forming polycrystalline $SnO_2$ conductive elements is illustrated in the drawings.

Figure 1:
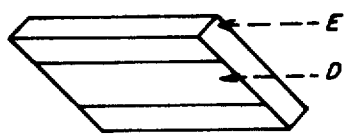
FIG. 1 is a view of a source of $SnCl_2$ and dopant.

In FIG. 1 a source of $SnCl_2$ and fluorine dopant A is contained in holder B. In FIG. 2 a soda-lime glass support D is attached to a holder E.

The method of coating the glass support is preferably chemical vapor deposition in a close-space configuration. Using this method, vapors are evaporated from a source to a support positioned from the source a distance no greater than the square root of the smaller of the surface areas of the source and of the support.

Figure 3:
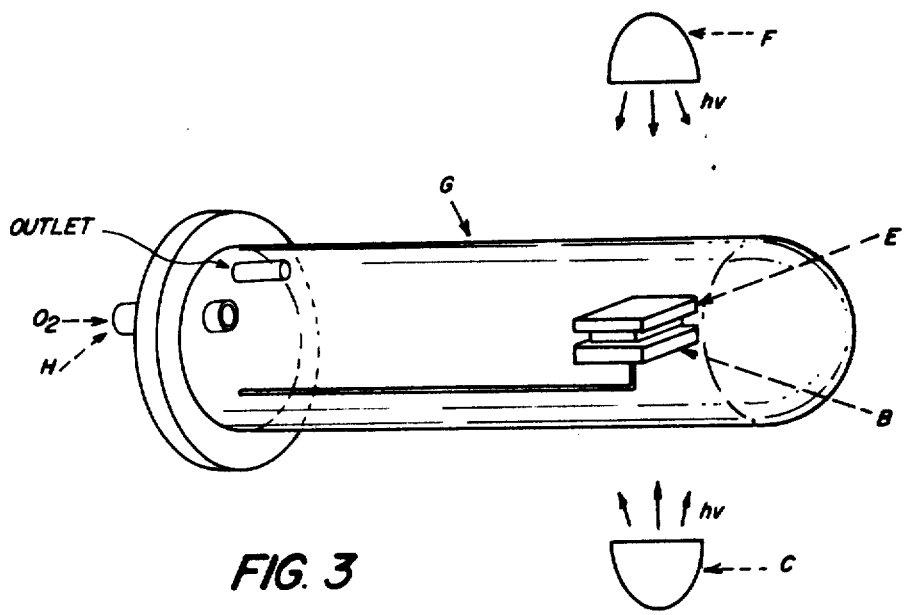
FIG. 3 is a view of apparatus useful in performing the method of this invention.

The chemical vapor deposition is illustrated in FIG. 3 where a glass enclosure G contains an inlet for oxygen or oxygen-enriched air H. The flow of gas is admitted into the enclosure to provide a suitable oxygen-rich atmosphere for the reaction of A and deposition of the oxide onto the support D. The gas flow rate is adjustable so that the desired gas pressure is maintained in the enclosure.

Holder E is heated by lamp F and holder B is heated by lamp C. The holders are formed from graphite or other heat tolerant substances and are heated by the lamps or by other techniques such as resistance heating and induction heating. After the heating process, the excess $SnCl_2$ and dopant vapors are preferably removed from the presence of the support (generally by the flow of oxygen before heating of the support is terminated).

The atmosphere for the vapor-phase depositing can be either pure oxygen, oxygen artifically admixed with other gasses, or air. As will be readily apparent, the actual amount of the oxygen present during deposition will depend upon the specific form of vapor-phase depositing that is selected. For example, chemical vapor deposition in a close-space configuration, a highly preferred form of the process of the invention, is generally carried out at atmospheric pressure. The other forms of vapor-phase depositing mentioned above have known or standard tolerance levels of gas, and the amount of oxygen pressure or partial pressure is selected to comply with such tolerance levels.

The vapor-phase depositing is done either as a batch process, e.g., in a process chamber containing a single source and a single support, or as a continuous process in which a support is moved through appropriate zones of treatment.

The evaporation is generally run at atmospheric pressure or slightly above atmospheric pressure. The spacing between source and support preferably is between about 2 and about 10 mm although distances of between one and 100 mm are useful. The temperature of the support is variable depending on which material is being evaporated. Preferably, the source material is deposited for a time of between about 0.1 second to about 10 minutes onto a support held at a temperature of between 450° C. and about 630° C. The source temperature is maintained in each instance between about 200° C. and about 400° C.

A photovoltaic cell is formed simply by using the formed electrode as a window electrode. A preferred cell is similar to those described in U.S. Pat. No. 4,207,119 except that the window electrode is as described above. Thus, the preferred cell comprises first and second contiguous polycrystalline layers containing respectively p-type cadmium telluride and n-type cadmium sulfide and the electrode described above in operative, low-impedance-contact with at least part of said layers. The construction and use of photovoltaic cells is disclosed in detail in U.S. Pat. No. 4,207,119 which is herein incorporated by reference.

The following examples further illustrate the invention.

EXAMPLE 1

Seven samples of transparent and electrically conductive tin oxide were prepared using the close-space evaporator described herein. The source was anhydrous $SnCl_2$ doped with one mole percent fluorine added as SnClF. The support was soda-lime glass with 90% transmittance. The spacing between the source and support was 5 mm. The process was carried out at atmospheric pressure with an oxygen flow of 1220 cc/min. The support was heated to 550° C.; and, immediately thereafter, the source was heated to 325° C. The deposition time was 1 min, 15 second, starting at the time the source reached 325° C. The average resistance of these seven samples was 12 ohm/square and the total transmittance was 80% of visible light between 400–800 nm. The thickness of the films varied between 0.37 and 0.43 μm. The films were haze-free.

EXAMPLE 2

Eight samples of transparent and electrically conductive tin oxide were prepared using the same close-space evaporator and essentially the same conditions described in Example 1 except that the dopant was 0.9 mole % fluorine and was added as $SnF_2$ to the anhydrous $SnCl_2$. The average of the results of this experiment was a resistance of 14 ohm/square and 79% total transmittance between 400 and 800 nm. The thickness of the films varied between 0.36 and 0.52 μm and the films were haze-free.

EXAMPLE 3

This is a comparative example. One sample of transparent and electrically conductive tin oxide was prepared using the close-space evaporator and essentially the same conditions described in Example 1 except no dopants were added to the anhydrous $SnCl_2$ source. The results of this experiment were a resistance of 63 ohm/square and 80 percent total transmittance between 400 and 800 nm. The thickness of this film was 0.57 μm. The importance of the fluorine doping is demonstrated with this example.

EXAMPLE 4

One sample of transparent and electrically conductive tin oxide was prepared using the close-space evaporator and essentially the same conditions described in Example 1, except the oxygen flow rate was 4000 cc/min. The results of this experiment were 9 ohm/square resistance and 80% total transmittance to visible light between 400–800 nm. The thickness of this sample was 0.39 μm. A solar cell of 9.5% efficiency was made on this glass, as described in U.S. Pat. No. 4,207,119, example 1, with the exception that the window electrode of this example was substituted for the Nesatron ® window used in U.S. Pat. No. 4,207,119.

EXAMPLE 5

Six samples of transparent, electrically-conducting, tin oxide-coated glass were prepared as described in Example 1, except that the source temperature was 315° C. and the support temperature was changed from sample to sample.

The electrical resistance and average transmittance to visible and near IR light (400–800 nm) of the resulting coatings was:

| Support Temperature (°C.) | Resistance (ohm/square) | Average % Specular Transmittance Visible Light |
|---|---|---|
| 400 | $2.5 \times 10^{-4}$ | 83% |
| 430 | 360 | 79% |
| 450 | 96 | 78% |
| 500 | 18 | 77% |
| 550 | 10 | 76% |
| 600 | 5.5 | 68% |

It is seen that support temperatures above 450° C. are desirable.

EXAMPLE 6

Three samples of transparent, electrically-conducting, tin oxide-coated glass were prepared in a close-space evaporator of similar design to that employed in Example 1, and utilizing the same experimental conditions except as noted below:

Air was used instead of oxygen, the flow-rate was 410 cc/min; the source temperature was 320° C., deposition time was 1 min; and the spacing between source and support was 2.5 mm.

The average electrical resistance of the three resulting samples was 15 ohm/square, and the average specular transmittance to visible and near IR light (400–800 nm) was 74%.

EXAMPLE 7

An apparatus was constructed in which a stream of gas flowed, in a confined channel, over a heated source-holder containing a mixture of $SnCl_2$ (99 mole %) and SnClF (1 mole %). After passing over the source, the stream of gas carried the $SnCl_2$/SnClF vapors over a distance of about five inches, and was then deflected to impinge on a heated soda-lime glass support, thus depositing on the glass a layer of doped tin oxide.

One sample of such tin oxide-coated glass was prepared in the above-described apparatus, while holding the source at 475° C., the support at 550° C., utilizing an oxygen flow of 3000 cc/min, and carrying out the deposition for 30 seconds. The resulting coating had an electrical resistance of 18 ohm/square, a thickness of 0.26 μm, and 75% average specular transmittance to visible and near IR light (400–800 nm).

The invention has been described in detail with particular reference to certain preferred embodiments thereof, but it will be understood that variations and modifications can be effected within the spirit and scope of the invention.

What is claimed is:

1. A conductive element comprising a soda-lime glass support having directly thereon a layer containing polycrystalline $SnO_2$ and from about 0.001 to about 5 weight percent of a fluorine-containing dopant, said conductive element being substantially haze-free and having a total transmittance to radiation between 400 and 800 nm greater than 70% and an electrical resistance less than 30 ohm/square.

2. The conductive element of claim 1 wherein the fluorine-containing dopant is selected from the group consisting of $SnF_2$ and $SnFCl$.

3. The conductive element of claim 1 wherein the thickness of the layer is from 1000 Å to 10,000 Å.

4. The conductive element of claim 1 wherein the polycrystalline $SnO_2$ has (200) and (110) planes that are oriented parallel to the glass surface.

5. A photovoltaic cell comprising contiguous crystalline semiconductive layers and the conductive element of claim 1 in operative, low-impedance contact with at least part of one of said layers.

6. The photovoltaic cell of claim 5 wherein the fluorine-containing dopant is selected from the group consisting of $SnF_2$ and $SnFCl$.

7. A photovoltaic cell comprising first and second contiguous crystalline layers containing, respectively, p-type cadmium telluride and n-type cadmium sulfide and the conductive element of claim 1 in operative, low-impedance contact with at least part of said first or second layer of said cell.

* * * * *